(12) United States Patent  
Miyauchi et al.

(10) Patent No.: US 7,916,429 B2  
(45) Date of Patent: Mar. 29, 2011

(54) MAGNETIC FIELD DETECTING ELEMENT HAVING THIN STACK WITH A PLURALITY OF FREE LAYERS AND THICK BIAS MAGNETIC LAYER

(75) Inventors: Daisuke Miyauchi, Tokyo (JP); Takahiko Machita, Tokyo (JP)

(73) Assignee: TDK Corporation, Tokyo (JP)

( * ) Notice: Subject to any disclaimer, the term of this patent is extended or adjusted under 35 U.S.C. 154(b) by 853 days.

(21) Appl. No.: 11/830,122

(22) Filed: Jul. 30, 2007

(65) Prior Publication Data

US 2009/0034133 A1    Feb. 5, 2009

(51) Int. Cl.  
*G11B 5/39* (2006.01)

(52) U.S. Cl. .................................. 360/319; 360/324.12

(58) Field of Classification Search ....... 360/324–324.2, 360/319  
See application file for complete search history.

(56) References Cited

U.S. PATENT DOCUMENTS

| | | | |
|---|---|---|---|
| 7,035,062 B1 | 4/2006 | Mao et al. | |
| 7,436,637 B2 * | 10/2008 | Pinarbasi | 360/324.11 |
| 7,615,996 B1 * | 11/2009 | Machita et al. | 324/252 |
| 2001/0050834 A1 | 12/2001 | Hasegawa et al. | |
| 2004/0141257 A1 * | 7/2004 | Hasegawa et al. | 360/314 |

FOREIGN PATENT DOCUMENTS

| | | |
|---|---|---|
| JP | 08-212517 | 8/1996 |
| JP | 09-185809 | 7/1997 |
| JP | 2002-123916 A | 4/2002 |
| JP | 2002-175611 A | 6/2002 |
| JP | 2004-221303 A | 8/2002 |
| JP | 2004-221303 A | 8/2004 |
| JP | 2005-244169 | 9/2005 |
| JP | 2006-179566 | 7/2006 |
| JP | 2006-294210 | 10/2006 |

OTHER PUBLICATIONS

Chinese Office Action issued by Chinese Patent Office on Apr. 13, 2010 for Chinese Counterpart Patent Application No. 200810128516.9.

* cited by examiner

*Primary Examiner* — William J Klimowicz  
(74) *Attorney, Agent, or Firm* — Knobbe Martens Olson & Bear LLP

(57) ABSTRACT

A magnetic field detecting element comprising: a stack including an upper and magnetic layer, a lower magnetic layer, and a non-magnetic intermediate layer sandwiched therebetween, an upper and lower shield electrode layer provided in a manner that they sandwich said stack therebetween in a direction of stacking of the stack, wherein the upper and lower shield electrode layer supply sense current in the direction of stacking and magnetically shield the stack; a bias magnetic layer provided on a surface of the stack, the surface being opposite to an air bearing surface of said stack, and insulating films provided on both sides of the stack with regard to a track width direction thereof. The bias magnetic layer has a larger thickness than the stack, and the upper shield electrode layer and/or said lower shield electrode layer includes an auxiliary shield layer which fills a stepped portion formed by the stack and bias magnetic layer.

12 Claims, 12 Drawing Sheets

MAGNETIC FIELD DETECTING ELEMENT HAVING THIN STACK WITH A PLURALITY OF FREE LAYERS AND THICK BIAS MAGNETIC LAYER

BACKGROUND OF THE INVENTION

1. Field of the Invention

The present invention relates to a magnetic field detecting element and a manufacturing method thereof, and more particularly, to the structure of a magnetic field detecting element having a plurality of free layers.

2. Description of the Related Art

As a reproduction element of a thin film magnetic head, GMR (Giant Magneto Resistance) elements are known. Hitherto, CIP (Current In Plane)-GMR element, in which sense current flows in a direction that is horizontal to the film surface of the element, have been mainly used. In recent years, however, in order to cope with higher density recording, elements have been developed in which sense current flows in a direction that is perpendicular to the film surface of the element. TMR elements utilizing the TMR (Tunnel Magneto-Resistance) effect, and CPP (Current Perpendicular to the Plane) elements utilizing the GMR effect are known as the elements of this type. In particular, the CPP element has high potential because it has low resistance as compared to the TMR element and because it exhibits high output even with a narrow track width as compared to the CIP element.

The CPP element includes a stack having a magnetic layer (free layer) whose magnetization direction changes in accordance with an external magnetic field, a magnetic layer (pinned layer) whose magnetization direction is fixed with respect to the external magnetic field, and a non-magnetic intermediate layer sandwiched between the pinned layer and the free layer. This stack is also called a spin-valve film. On both sides of the spin-valve film with regard to the track width direction, bias magnetic layers for applying a bias magnetic field to the free layer are provided. The free layer is magnetized into a single magnetic state by a bias magnetic field emitted from the bias magnetic layers. This provides an improvement in linearity of a change in resistance with respect to a change in an external magnetic field and an effective reduction in Barkhausen noise. A relative angle between the magnetization direction of the free layer and the magnetization direction of the pinned layer changes in accordance with an external magnetic field, and as a result, electric resistance of sense current that flows in a direction perpendicular to the film surface of the spin-valve film is changed. By making use of this property, external magnetization is detected. The spin-valve film is magnetically shielded by shield layers on both sides thereof with regard to the direction of stacking. The direction of stacking of the spin-valve film corresponds to the circumferential direction of a recording medium when a thin film magnetic head is incorporated into a hard disc drive. Therefore, the shield layers have a role of shielding a magnetic field emitted from adjacent bits on the same track of the recording medium.

In recent years, higher track recording density is desired. However, an improvement in track recording density requires reduction in spacing between upper and lower shield layers (a gap between shields). In order to achieve this, a decrease in thickness of the spin-valve film is required. However, there is large limitation that originates from the layer configuration in the conventional CPP elements. Specifically, since the pinned layer requires that the magnetization direction be firmly fixed without being influenced by an external magnetic field, a so-called synthetic pinned layer is usually used. The synthetic pinned layer includes an outer pinned layer, an inner pinned layer, and a non-magnetic intermediate layer which consists of Ru or Rh and which is sandwiched between the outer pinned layer and the inner pinned layer. Moreover, an antiferromagnetic layer is provided in contact with the outer pinned layer in order to fix the magnetization direction of the outer pinned layer. The antiferromagnetic layer typically consists of IrMn. In the synthetic pinned layer, the antiferromagnetic layer is coupled to the outer pinned layer via exchange-coupling so that the magnetization direction of the outer pinned layer is fixed. The inner pinned layer is antiferromagnetically coupled to the outer pinned layer via the non-magnetic intermediate layer so that the magnetization direction of the inner pinned layer is fixed. Since the magnetization directions of the inner pinned layer and the outer pinned layer are anti-parallel to each other, magnetization of the pinned layer is limited as a whole. Despite such a merit of the synthetic pinned layer, however, a large number of layers are required to constitute a CPP element that includes the synthetic pinned layer. This imposes limitation on a reduction in the thickness of the spin-valve film.

Meanwhile, a novel layer configuration that is entirely different from that of the above-mentioned conventional spin-valve film has been proposed in recent years. In "Current-in-Plane GMR Trilayer Head Design for Hard-Disk Drives" (IEEE TRANSACTIONS ON MAGNETICS, Vol. 43, No. 2, February 2007), a stack used for the CIP element, which includes two free layers and a non-magnetic intermediate layer that is sandwiched between the free layers, is disclosed. Each of the magnetization direction of the free layers changes in accordance with an external magnetic field. A bias magnetic layer is provided on the side of the stack opposite to the air bearing surface, and a bias magnetic field is applied in a direction that is perpendicular to the air bearing surface. The magnetization directions of the two free layers adopt a certain relative angle because of the magnetic field applied from the bias magnetic layer. If an external magnetic field is applied in this state, then the magnetization directions of two free layers are changed. As a result, the relative angle between the magnetization directions of the two free layers is changed, and accordingly, electric resistance of sense current is changed. By making use of such a property, it becomes possible to detect an external magnetic field. Moreover, in U.S. Pat. No. 7,035,062, an example is disclosed in which such a layer configuration is applied to the CPP element. Such a layer configuration using two free layers has a potential for facilitating a reduction in the gap between the shield layers, because it does not require the conventional synthetic pinned layer and the antiferromagnetic layer, allowing a simplified layer configuration.

However, such a stack using two free layers has the problem described below. First, when the stack thickness is decreased, the thickness of the bias magnetic layer is decreased together depending on the decrease in the stack thickness. Next, since the bias magnetic layer is provided facing only one surface of the stack, which is different from the conventional art, the magnetic field itself is apt to be dispersed, and efficient application of a magnetic field to the free layer is difficult. For these reasons, it is difficult to ensure a magnetic field intensity of the bias magnetic layer that is necessary for magnetizing the free layers into a single magnetic domain. To solve this problem, it is necessary to ensure the thickness of the bias magnetic layer. However, if the stack thickness is determined in a manner that it corresponds to the thickness of the bias magnetic layer, a large decrease in the gap between the shields cannot be expected.

SUMMARY OF THE INVENTION

The present invention is directed to a CPP type magnetic field detecting element having a layer configuration that includes a stack with more than one free layers and that has a bias magnetic layer on the back side of the stack when viewed from the air bearing surface. One object of the present invention is to provide a magnetic field detecting element having the above-mentioned layer configuration that is capable of applying a sufficient bias magnetic field to the free layers, and of reducing the gap between the shields. Another object of the present invention is to provide a method of manufacturing such a magnetic field detecting element.

According to an embodiment of the present invention, a magnetic field detecting element comprising: a stack including an upper magnetic layer, a lower magnetic layer and a non-magnetic intermediate layer sandwiched between said upper magnetic layer and said lower magnetic layer, wherein magnetization directions of said upper magnetic layer and said lower magnetic layer change in accordance with an external magnetic field; an upper shield electrode layer and a lower shield electrode layer which are provided in a manner that they sandwich said stack therebetween in a direction of stacking of said stack, wherein said upper shield electrode layer and said lower shield electrode layer supply sense current in the direction of stacking and magnetically shield said stack; a bias magnetic layer which is provided on a surface of said stack, the surface being opposite to an air bearing surface of said stack, wherein said bias magnetic layer applies a bias magnetic field to said upper magnetic layer and to said lower magnetic layer in a direction perpendicular to the air bearing surface; and insulating films which are provided on both sides of said stack with regard to a track width direction thereof. The bias magnetic layer has a larger thickness than said stack, and said upper shield electrode layer and/or said lower shield electrode layer includes an auxiliary shield layer which fills a stepped portion, the stepped portion being formed by said stack and said bias magnetic layer.

In accordance with this structure, the need for providing an antiferromagnetic layer and a synthetic pinned layer in the stack is obviated, and a reduction in the stack thickness is facilitated. On the other hand, the thickness of the bias magnetic layer can be set, independently of the stack thickness, to a thickness that is necessary for applying a required bias magnetic field. As a result, the thickness of the bias magnetic layer becomes larger than the stack thickness, and a stepped portion may be formed between the bias magnetic layer and the stack. However, since the auxiliary shielding layer is formed at the stepped portion, the magnetic field emitted from the adjacent bit on the same track of a recording medium can be effectively shielded. In this way, it is possible to apply a sufficient bias magnetic field to the free layers while reducing the gap between the shields, and thereby to provide a magnetic field detecting element which is easy to cope with high track recording density.

According to another embodiment of the present invention, a method of manufacturing a magnetic field detecting element, comprising: a stack forming step which includes forming a stack on a lower shield electrode layer, wherein said stack includes a lower magnetic layer whose magnetization direction changes in accordance with an external magnetic field, a non-magnetic intermediate layer, and an upper magnetic layer whose magnetization direction changes in accordance with the external magnetic field, said lower magnetic layer, said non-magnetic intermediate layer, and said upper magnetic layer being stacked in this order; an insulating film forming step which includes removing said stack except for a first part which extends perpendicularly to a plane that is to be an air bearing surface, and filling a portion of said stack that is removed with insulating films; a step of forming an auxiliary shield layer on said insulating films and on said first part; a bias magnetic layer forming step which includes removing said auxiliary shield layer, said stack, and at least a part of said lower shield electrode layer except for a second part which extends in parallel with the plane that is to be the air bearing surface, and filling a part of the removed portion with a bias magnetic layer; and forming an upper shield electrode layer on said upper auxiliary shield layer and on said bias magnetic layer such that said upper shield electrode layer is integrated with said auxiliary shield layer.

The above and other objects, features and advantages of the present invention will become apparent from the following description with reference to the accompanying drawings which illustrate examples of the present invention.

DESCRIPTION OF THE PREFERRED EMBODIMENTS

Figure 1:
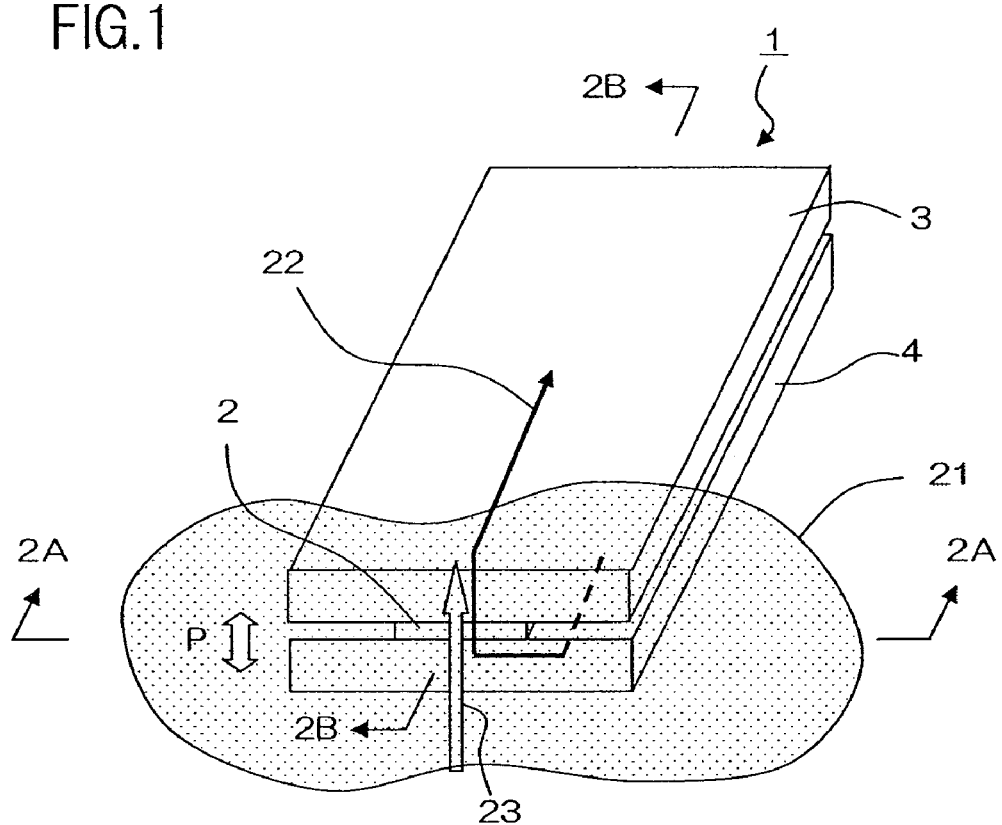
FIG. 1 is a conceptual perspective view of a magnetic field detecting element according to an embodiment of the present invention.
Figure 2A:
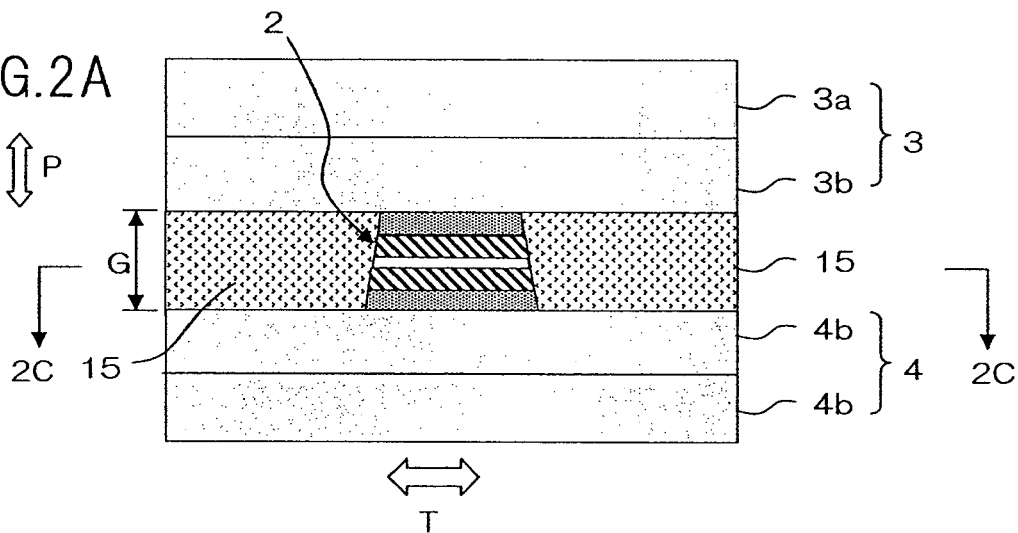
FIG. 2A is a cross sectional view of the magnetic field detecting element when viewed from 2A-2A direction of FIG. 1.
Figure 2B:
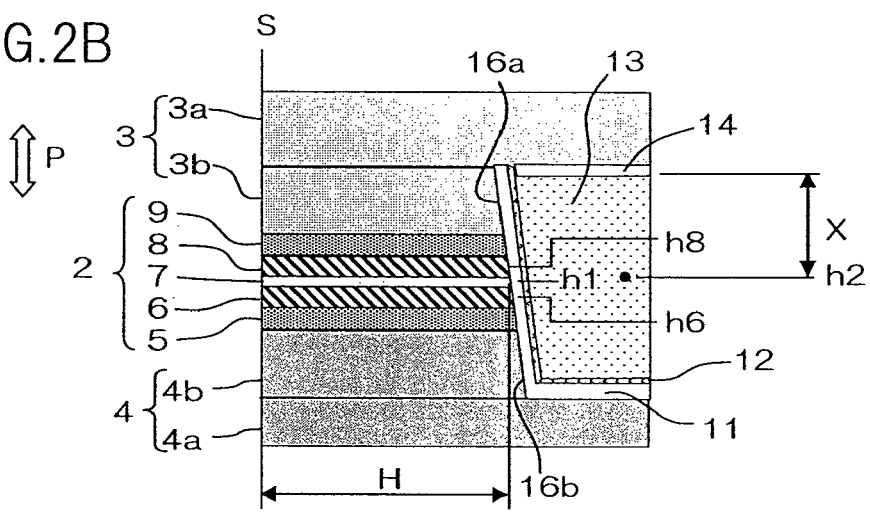
FIG. 2B is a cross sectional view of the magnetic field detecting element along 2B-2B line of FIG. 1.
Figure 2C:
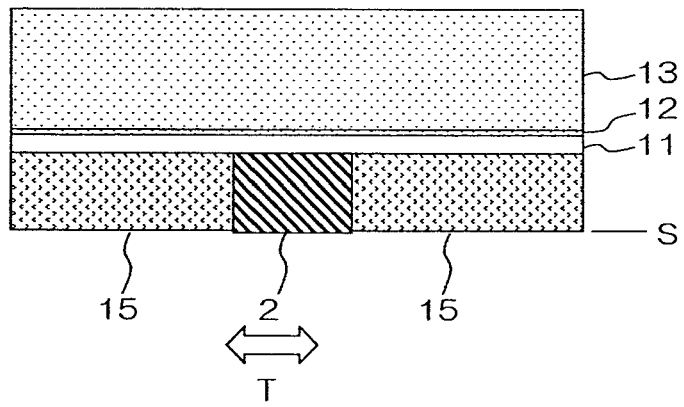
FIG. 2C is a cross sectional view along 2C-2C line of FIG. 2A.

An embodiment of the present invention will now be described with reference to the attached drawings. A magnetic field detecting element of the present embodiment is particularly suitable for use as a read head portion of a thin film magnetic head of a hard disc drive. FIG. 1 is a conceptual perspective view of a magnetic field detecting element of the present embodiment. FIG. 2A is a side view of the magnetic field detecting element when viewed from 2A-2A direction of FIG. 1, i.e., viewed from the air bearing surface. FIG. 2B is a cross sectional view of the magnetic field detecting element taken along 2B-2B line of FIG. 1. FIG. 2C is a cross sectional view of the magnetic field detecting element taken along 2C-2C line of FIG. 2A. The air bearing surface refers to the surface of magnetic field detecting element 1 that faces recording medium 21.

Magnetic field detecting element 1 includes stack 2, upper shield electrode layer 3 and lower shield electrode layer 4 which are provided such that they sandwich stack 2 in the direction of stacking, bias magnetic layer 13 provided on the surface of stack 2 that is opposite to air bearing surface S, and insulating films 15 provided on both sides of stack 2 with regard to track width direction T.

Stack 2 is sandwiched between upper shield electrode layer 3 and lower shield electrode layer 4 with the tip end thereof exposed at air bearing surface S. Stack 2 is adapted such that sense current 22 is caused to flow in direction P that is perpendicular to the film surface when a voltage is applied between upper shield electrode layer 3 and lower shield electrode layer 4. Magnetic field of recording medium 21 at the position facing stack 2 changes in accordance with the movement of recording medium 21 in moving direction 23. The change in magnetic field is detected as a change in electric resistance which is caused by the magneto-resistance effect. Based on this principle, magnetic field detecting element 1 reads magnetic information that is recorded in each magnetic domain of recording medium 21.

An example of a layer configuration of stack 2 is shown in Table 1. In the table, the layers are shown in the order of stacking, from buffer layer 5 in the bottom column, which is on the side of lower shield electrode layer 4, toward cap layer 9 in the top column, which is on the side of upper shield electrode layer 3. In Table 1, the numerals in the row of "Composition" indicate atomic fractions of the elements. Stack 2 has the layer configuration having buffer layer 5, lower magnetic layer 6, conductive non-magnetic intermediate layer 7, upper magnetic layer 8, and cap layer 9, which are stacked in this order on lower shield electrode layer 4 that is made of an 80Ni20Fe layer having a thickness of about 1 μm.

TABLE 1

| Layer Configuration | Composition | Thickness(nm) |
|---|---|---|
| Cap Layer 9 | Ru | 4 |
| Upper Magnetic Layer 8 | Co70Fe30 | 1 |
|  | Ni80Fe20 | 2.5 |
|  | Co70Fe30 | 1 |
| Non-magnetic Intermediate Layer 7 | Cu | 1.3 |
| Lower Magnetic Layer 6 | Co70Fe30 | 1 |
|  | Ni80Fe20 | 2.5 |
|  | Co70Fe30 | 1 |
| Buffer Layer 5 | NiCr | 3 |
|  | Ta | 1 |
|  | (Total) | 18.3 |

Buffer layer 5 is provided as a seed layer for lower magnetic layer 6. Both lower magnetic layer 6 and upper magnetic layer 8, which have layer configurations in which a NiFe layer is sandwiched by CoFe layers, are magnetic layers whose magnetization directions are changed in accordance with an external magnetic field. Non-magnetic intermediate layer 7 is made of Cu. The thickness of the Cu layer of non-magnetic intermediate layer 7 is 1.3 nm. Cu exhibits the largest binding energy at this thickness, allowing lower magnetic layer 6 and upper magnetic layer 8 to be magnetically strongly coupled via antiferromagnetic coupling. By providing the CoFe layers in lower magnetic layer 6 and in upper magnetic layer 8, the spin polarization factor is increased at the interfaces of the Cu layer as compared to the layer configuration in which the Cu layer and the NiFe layer is in direct contact, and thus the magnetic resistance effect is enhanced. Instead of the layer configuration shown in Table 1, a single layer configuration consisting of a Co70Fe30 layer may be used for lower magnetic layer 6 and/or upper magnetic layer 8. Cap layer 9 is provided to prevent deterioration of the layers formed beneath. On cap layer 9, upper shield electrode layer 3, which is made of a 80Ni20Fe layer having a thickness of about 1 μm, is formed.

Upper shield electrode layer 3 and lower shield electrode layer 4 function as electrodes for supplying sense current to stack 2 in direction of stacking P, and also function as shield layers for shielding a magnetic field emitted from adjacent bits on the same track of recording medium 21, as described above.

An example of a layer configuration of the portion that is located on the back side of stack 2 when viewed from the air bearing surface is shown in Table 2. In the table, the layers are shown in the order of stacking, from insulating layer 11 in the bottom column toward cap layer 14 in the top column. In Table 2, the numerals in the row of "Composition" indicate atomic fractions of the elements. Bias magnetic layer 13 is provided such that it faces the surface of stack 2 that is opposite to air bearing surface S. Bias magnetic layer 13 applies a bias magnetic field to stack 2, particularly to upper magnetic layer 8 and lower magnetic layer 6, in a direction that is perpendicular to air bearing surface S. Bias magnetic layer 13 is formed on seed layer 12 in order to ensure good magnetic characteristics (high coercive force and rectangular ratio) as a bias magnetic layer. Insulating layer 11 consisting of an $Al_2O_3$ layer is formed between seed layer 12 and stack 2. As shown in FIG. 2B, insulating layer 11 is also formed on the side surface of stack 2 in order to prevent sense current 22 from flowing in bias magnetic layer 13. Cap layer 14 consisting of a Cr layer, an $Al_2O_3$ layer, and a Ti layer is provided on bias magnetic layer 13. Similarly to seed layer 12, the Cr layer is provided to ensure good magnetic characteristics. The $Al_2O_3$ layer is provided to prevent sense current 22 from flowing in bias magnetic layer 13. The Ti layer is provided to ensure sufficient contact of upper shield electrode layer 3.

TABLE 2

| Layer Configuration | Composition | Thickness(nm) |
|---|---|---|
| Cap Layer 14 | Ti | 1 |
|  | $Al_2O_3$ | 7 |
|  | Cr | 3 |
| Bias Magnetic Layer 13 | 80Co20Pt | 30 |
| Seed Layer 12 | Cr | 3 |
| Insulating Layer 11 | $Al_2O_3$ | 7 |

Insulating layers 15 consisting of $Al_2O_3$ are provided on both sides of stack 2 with regard to track width direction T. Insulating layer 15 also serves to prevent sense current 22 from flowing in bias magnetic layer 13.

Figure 3:
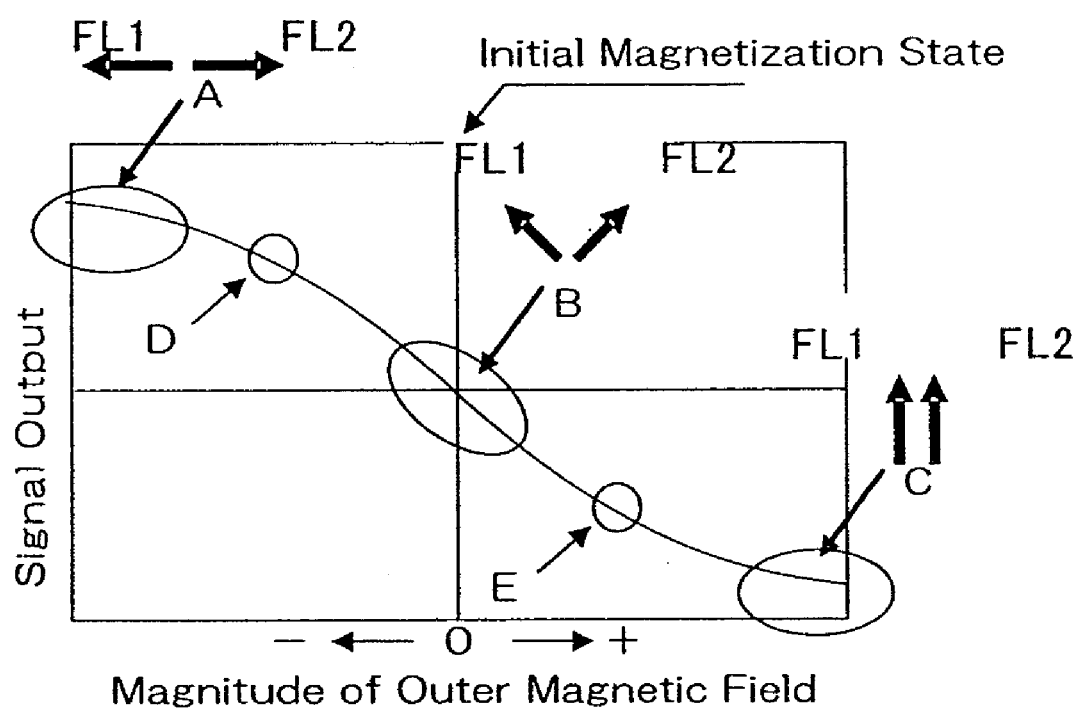
FIG. 3 is a conceptual view showing an operation principle of the magnetic field detecting element shown in FIG. 1.
Figure 4:
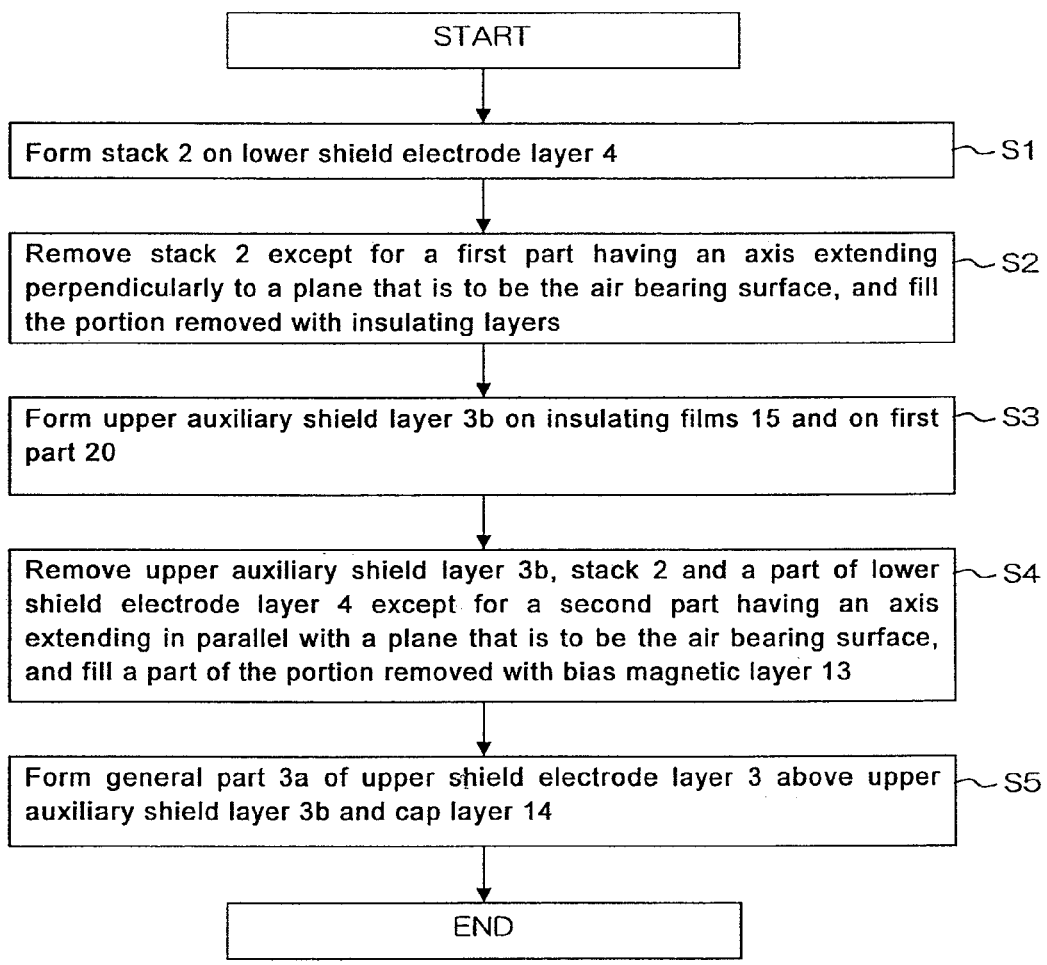
FIG. 4 is a flow chart explaining a method of manufacturing the magnetic field detecting element shown in FIG. 1.

FIG. 3 is a conceptual view showing the operation principle of the magnetic field detecting element of the present embodiment. The abscissa indicates magnitude of external magnetic field, and the ordinate indicates signal output. In the figure, the magnetization direction of upper magnetic layer 8 and the magnetization direction of lower magnetic layer 6 are indicated by FL1 and FL2, respectively. When neither a bias magnetic field emitted from bias magnetic layer 13 nor an external magnetic field emitted from recording medium 21 does not exist, the magnetization direction of upper magnetic layer 8 and the magnetization direction of lower magnetic layer 6 are anti-parallel to each other due to the above-described antiferromagnetic coupling (A in the figure). However, since a bias magnetic field is applied actually, the magnetization direction of upper magnetic layer 8 and the magnetization direction of lower magnetic layer 6 are rotated from the anti-parallel state toward a parallel state, reaching an intermediate state between the anti-parallel state and the parallel state at an initial magnetization state (the state in which only a bias magnetic field is applied) (B in the figure). When an external magnetic field is applied from recording medium 21 in this state, the relative angle between the magnetization direction of upper magnetic layer 8 and the magnetization direction of lower magnetic layer 6 increases (a state closer to the anti-parallel state) or decreases (a state closer to the parallel state) in accordance with the direction of the magnetic field. If the state comes close to the anti-parallel state, then electrons emitted from the electrode are apt to be scattered, leading to an increase in electric resistance of the sense current. If the state comes close to the parallel state, then electrons emitted from electrode are less apt to be scattered, leading to a decrease in the electric resistance of the sense current. In this way, by utilizing the change in the relative angle between the magnetization direction of upper magnetic layer 8 and the magnetization direction of lower magnetic layer 6, an external magnetic field can be detected.

In the present embodiment, as a result of adjusting the thickness, the configuration, etc. of bias magnetic layer 13, the magnetization direction of upper magnetic layer 8 and the magnetization direction of lower magnetic layer 6 are approximately perpendicular to each other in the initial magnetization state (B in FIG. 3). Because the magnetization directions are perpendicular to each other in the initial magnetization state, a large change in output against a change in an external magnetic field, and thus, a large change in magnetic resistance can be obtained, and good asymmetry can also be obtained. If the bias magnetic field is insufficient, then the initial magnetization state becomes close to the anti-parallel state (A in FIG. 3), leading to low output and large asymmetry. Similarly, if the bias magnetic field is excessive, then the initial magnetization state becomes close to the parallel state (C in FIG. 3), leading to low output and large asymmetry.

As seen in Tables 1 and 2, bias magnetic layer 13 has a thickness of 30 nm, and stack 2 has a thickness of 17.3 nm. In other words, bias magnetic layer 13 has a larger thickness than stack 2. This is a feature that is greatly different from a conventional CPP element. In the conventional CPP element, the thickness of the bias magnetic layers provided on both sides of the spin-valve film with regard to the track width direction is determined such that it corresponds to the thickness of the spin-valve film. When necessary layers are arranged such that they have necessary thicknesses, the conventional spin-valve film, which corresponds to stack 2 of the present embodiment, has a thickness of 30 to 40 nm. Since the minimum thickness of the bias magnetic layer required for ensuring a predetermined bias magnetic field is about 30 nm, the minimum necessary thickness of the bias magnetic layer is accordingly ensured. However, in the present embodiment, since the configuration of stack 2 is greatly simplified, the thickness is also reduced to a large degree. For this reason, in the present embodiment, the thickness of bias magnetic layer 13 is set, independently of stack 2, so that it ensures a necessary bias magnetic field.

As a result, as shown in FIG. 2B, upper stepped portion 16a and lower stepped portion 16b are formed by stack 2 and bias magnetic layer 13 at the upper and lower portions of stack 2, respectively. In the present embodiment, upper auxiliary shield layer 3b and lower auxiliary shield layer 4b are provided to fill these stepped portions 16a, 16b, respectively. In other words, upper shield electrode layer 3 includes general part 3a and upper auxiliary shield layer 3b that is projected downward from general part 3a with regard to the direction of stacking, and lower shield electrode layer 4 includes general part 4a and lower auxiliary shield layer 4b projected upward from general part 4a with regard to the direction of stacking. Upper auxiliary shield layer 3b is integrated with general part 3a, and is magnetically coupled to general part 3a. Lower auxiliary shield layer 4b is also integrated with general part 4a, and is magnetically coupled to general part 4a. General part 3a extends above stack 2 and bias magnetic layer 13 in a direction perpendicular to air bearing surface S. The length of upper auxiliary shield layer 3b is substantially corresponds to height H (length measured in a direction perpendicular to air bearing surface S) of stack 2, and upper auxiliary shield layer 3b terminates at a position that is in contact with bias magnetic layer 13. The same applies to lower auxiliary shield layer 4b.

Since upper auxiliary shield layer 3b and lower auxiliary shield layer 4b are constituted as a part of upper shield electrode layer 3 and lower shield electrode layer 4, respectively, they function as electrodes for applying sense current, as well as shield layers for shielding a magnetic field emitted from an adjacent bit on the same track of recording medium 21. Namely, when magnetic field detecting element 1 is viewed from a recording medium, stack 2 is surrounded by upper auxiliary shield layer 3b and lower auxiliary shield layer 4b, as shown in FIG. 2A. Thus, upper auxiliary shield layer 3b and lower auxiliary shield layer 4b define actual gap G between the shields of magnetic field detecting element 1.

Referring to FIG. 2B, elevation h2 of bias magnetic layer 13, which is the elevation of the middle point of bias magnetic layer 13 measured in the direction of stacking, corresponds to elevation h1 that is equidistant from elevation h8 of upper magnetic layer 8, which is the elevation of the middle point of upper magnetic layer 8 measured in the direction of stacking, and elevation h6 of lower magnetic layer 6, which is the elevation of the middle point of lower magnetic layer 6 measured in the direction of stacking. Namely, since upper magnetic layer 8 and lower magnetic layer 6 are arranged such that they are symmetrical with each other with respect to the middle point of bias magnetic layer 13, bias magnetic fields of the substantially same magnitude are applied to upper magnetic layer 8 and lower magnetic layer 6, leading to an improvement in linearity as a magnetic field detecting element.

Upper auxiliary shield layer 3b extends in a planar shape on insulating films 15. Therefore, formation of magnetic poles in upper auxiliary shield layer 3b and unnecessary application of magnetic field is prevented. Moreover, because of the planar configuration of upper auxiliary shield layer 3b, the magnetization direction of upper auxiliary shield layer 3b tends to be directed to the track width direction due to shape anisotropic effect. This makes it easy to ensure permeability, and enhances the function of upper auxiliary shield layer 3b as a shield.

It should be noted that, in an embodiment, only the upper shield electrode layer or only the lower shield electrode layer includes upper auxiliary shield layer 3b or lower auxiliary shield layer 4b. Namely, either the upper shield electrode layer or the lower shield electrode layer may have a planar shape.

In the magnetic field detecting element of the present embodiment, stack 2 is constituted by only stacking layers that are functionally required in a manner that they have necessary thicknesses, as stated above. As a result, the antiferromagnetic layer and the outer pinned layer become unnecessary, leading to a significant reduction in thickness as compared to the spin-valve film of the conventional CPP element. On the other hand, the thickness of bias magnetic layer 13 that is functionally required can be determined, independently of stack 2. Further, since upper auxiliary shield layer 3b and lower auxiliary shield layer 4b are formed at the stepped portions, which originates from the configuration in which the thickness of stack 2 is smaller than the thickness of bias magnetic layer 13, the reduction in thickness of stack 2 is directly reflected in the reduction in the gap between the shields. In this way, it becomes possible to achieve a reduction in the gap between the shields while ensuring a necessary bias magnetic field. Moreover, in the conventional CPP elements, only the inner pinned layer of the synthetic pinned layer directly contributes to a change in magnetic resistance. The outer pinned layer and the antiferromagnetic layer do not contribute to a change in magnetic resistance, but rather constitutes a cause that obstructs improvement in the magnetic resistance ratio. However, in the present embodiment, since the outer pinned layer and the antiferromagnetic layer are unnecessary, and therefore, parasitic resistance is decreased, there is large potential of further improvement in the magnetic resistance ratio.

Figure 5A:
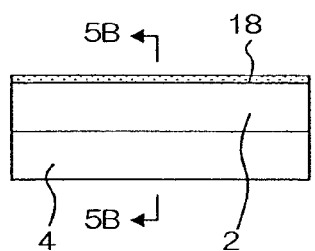
FIGS. 5A to 13C are step diagrams explaining the method of manufacturing the magnetic field detecting element shown in FIG. 1.
Figure 5B:
Figure 5C:
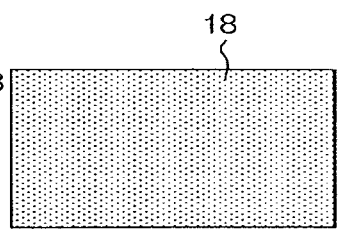
Figure 6A:
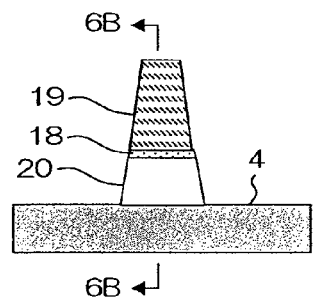

A method of manufacturing the above-mentioned magnetic field detecting element will now be described with reference to the flowchart of FIG. 4 and FIGS. 5A to 13C. FIGS. 5A, 6A . . . 13A show cross sectional views of a wafer that is cut along a plane that is to be an air bearing surface, FIGS. 5B, 6B . . . 13B show cross sectional views of the wafer that is cut along a plane that is perpendicular to a plane that is to be an air bearing surface, and FIGS. 5C, 6C, . . . , 13C are top views of the wafer. Positions of cross sections in FIGS. 5B, 6B, . . . , 13B are shown in FIGS. 5A, 6A, . . . , 13A, respectively.

(Step S1) First, lower shield electrode layer 4 is prepared by the plating process. Next, as shown in FIGS. 5A to 5C, stack 2 is formed on lower shield electrode layer 4 by sputtering (stack forming step). As described above, stack 2 includes lower magnetic layer 6 whose magnetization direction changes in accordance with an external magnetic field, conductive non-magnetic intermediate layer 7 and upper magnetic layer 8 whose magnetization direction changes in accordance with an external magnetic field. Lower magnetic layer 6 on the lower side with regard to the direction of stacking, non-magnetic intermediate layer 7 and upper magnetic layer 8 on the upper side with regard to the direction of stacking are included in stack 2 in this order. Stack 2, which includes cap layer 9 consisting of a Ru layer, further includes Ta layer 18 (thickness 2 nm) when deposition is conducted. Ta layer 18 is formed on the Ru layer as part of cap layer 9. Ta layer 18 functions as a protective layer of stack 2 when planarizing insulating films 15 at a subsequent step.

Figure 6B:
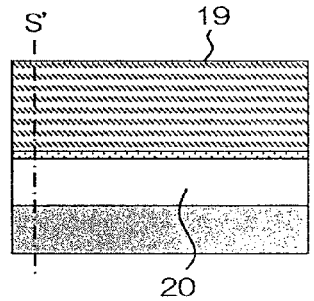
Figure 6C:
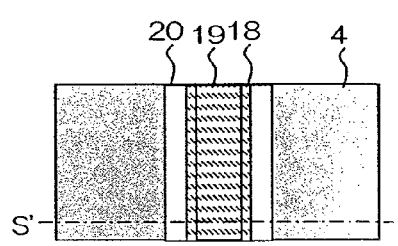
Figure 14:
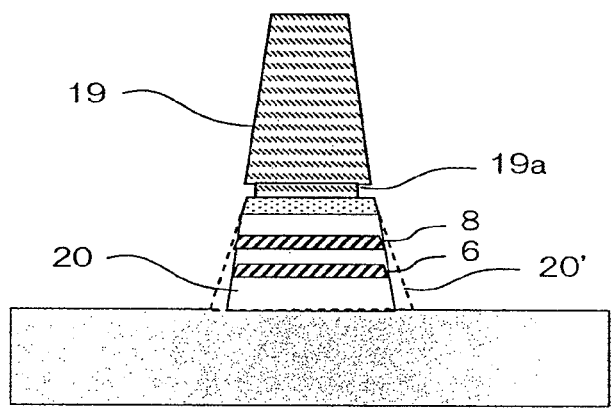
FIG. 14 is a cross sectional view of resist having an undercut.

(Step S2) Next, stack 2 is removed except for a first part having an axis extending perpendicularly to a plane that is to be the air bearing surface, and the portion removed is filled with insulating layers (insulating layer forming step). Specifically, as shown in FIGS. 6A to 6C, resist 19 is deposited on Ta layer 18, is then formed in a predetermined shape. Next, using resist 19 as a mask, stack 2 is removed except for elongated first part 20 extending perpendicular to plane S' that is to be the air bearing surface. Resist 19 preferably does not have an undercut. FIG. 14 shows a cross sectional view of resist including an undercut. If undercut 19a is included, it is difficult for stack 2 to be formed in a steep shape by means of milling. As a result, first part 20' having a cross section in which a ratio of the lower side to the upper side is increased is apt to be formed, as shown by the broken lines in the figure. Conventionally, resist having an undercut may be formed taking into consideration facilitation of lift-off. However, in the present embodiment, resist shape which does not include such an undercut is used so that lower magnetic layer 6 and upper magnetic layer 8 are formed in the same shape as much as possible. If they are formed in the same shape, then the same magnetic characteristics can be obtained. This is desirable for performance as a magnetic field detecting element.

Figure 7A:
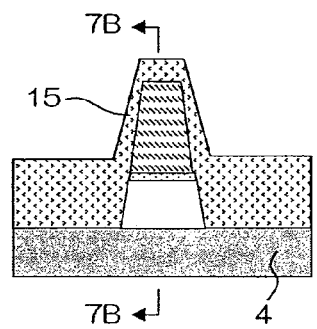
Figure 7B:
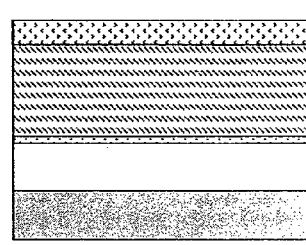
Figure 7C:
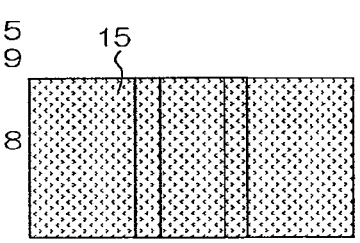
Figure 8A:
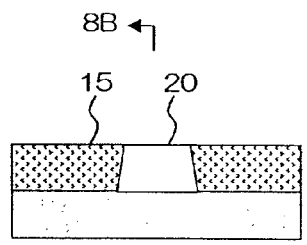
Figure 8B:
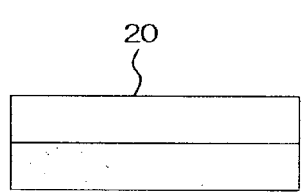
Figure 8C:
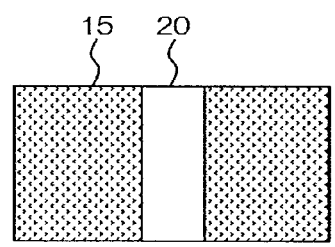

Thereafter, as shown in FIGS. 7A to 7C, insulating films 15 consisting of $Al_2O_3$ is deposited on resist 19 and on lower shield electrode layer 4. Further, as shown in FIGS. 8A to 8C, resist 19 and insulating films 15 are removed by the lift-off process. It is preferable that insulating films 15 be planarized so that the upper surface of insulating films 15 is flush with the upper surface of stack 2 (first part 20). One reason for the planarization is to form upper auxiliary shield layer 3b in a planar shape at a subsequent step. Another reason is to remove burrs that may occur between resist 19 and the upper surface of first part 20 in the lift-of process. As described above, burrs tend to occur in the lift-off process as compared to the configuration in which undercut 19a is provided because no undercut 19a is provided in resist 19. The planarization may be performed by means of, e.g., the chemical mechanical polishing process (CMP process). Since $Al_2O_3$ used in insulating films 15 matches the CMP process well, insulating films 15 are polished in a planar shape. Ta layer 18, which is a hard material, serves to protect stack 2 in the polishing process.

Figure 9A:
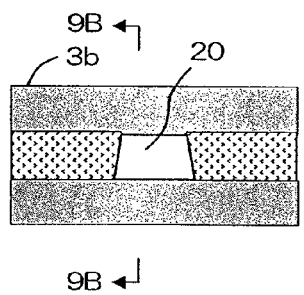
Figure 9B:
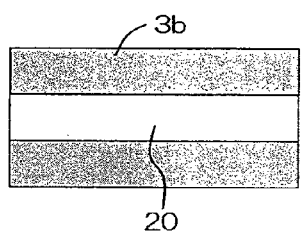
Figure 9C:
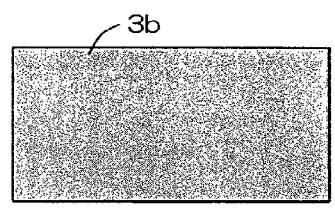

(Step 3) Next, as shown in FIGS. 9A to 9C, upper auxiliary shield layer 3b is formed on insulating films 15 and on first part 20 by means of the sputtering process. The thickness of upper auxiliary shield layer 3b depends on the thickness of bias magnetic layer 13. It should be noted that Ta layer 18 is removed by the sputtering process prior to forming upper auxiliary shield layer 3b.

Figure 10A:
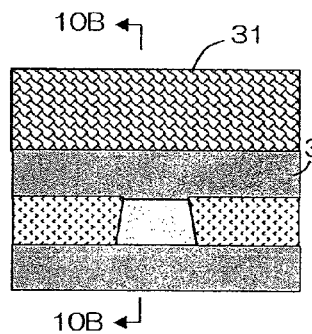
Figure 10B:
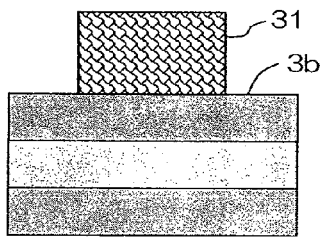
Figure 10C:
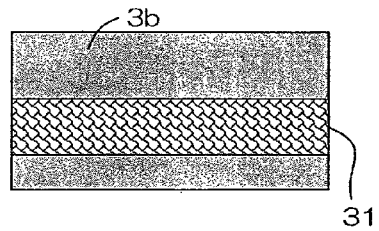
Figure 11A:
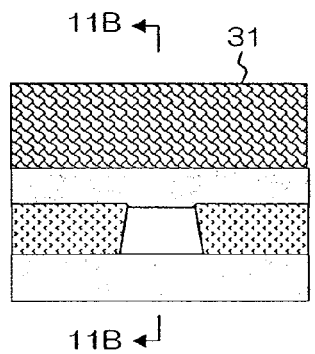
Figure 11B:
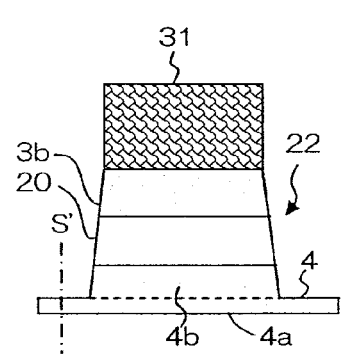
Figure 11C:
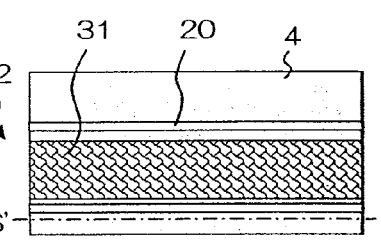

(Step 4) Next, upper auxiliary shield layer 3b, stack 2 and a part of lower shield electrode layer 4 are removed except for a second part having an axis extending in parallel with a plane that is to be the air bearing surface, and a part of the portion removed is filled with bias magnetic layer 13 (bias magnetic layer forming step). First, as shown in FIGS. 10A to 10C, resist 31 is deposited on upper auxiliary shield layer 3b, and resist 31 is then formed in a predetermined shape. Resist 31 preferably does not include an undercut, similarly to resist 19. The reason is the same as in the case of resist 19. As a result, three sides of stack 2, which are both sides of stack 2 with regard to the track width direction and the surface that is opposite to air bearing surface S, are formed in steep shapes. Next, as shown in FIGS. 11A to 11C, using resist 31 as a mask, upper auxiliary shield layer 3b, stack 2 and lower shield electrode layer 4 are removed by means of milling except for second part 22 having an axis extending in parallel with plane S' that is to be the air bearing surface. The milling depth of lower shield electrode layer 4 depends on the thickness of bias magnetic layer 13. As a result of the milling, lower shield electrode layer 4 including general part 4a and lower auxiliary shield layer 4b is formed. Milling may be performed up to the bottom surface of lower shield electrode layer 4, as needed.

Figure 12A:
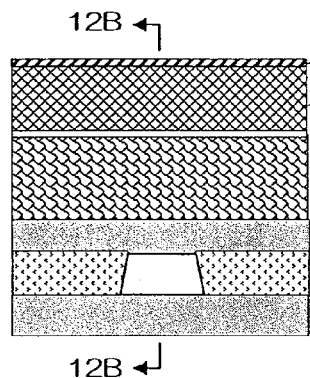
Figure 12B:
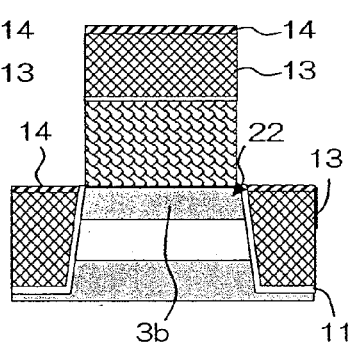
Figure 12C:
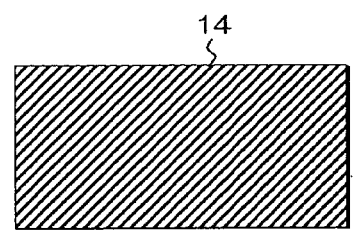

Thereafter, as shown in FIGS. 12A to 12C, insulating layer 11, seed layer 12, bias magnetic layer 13 and cap layer 14 are deposited (seed layer 12 is not illustrated.). Insulating layer 11 and seed layer 12 are formed by means of the ion-beam sputtering process. Insulating layer 11 is deposited at a relatively low angle of about 40 degrees so that it is securely attached onto the side walls of stack 2 to ensure electric insulation. Instead of the ion beam sputtering process, low temperature CVD (Chemical Vapor Deposition) may also be used. The thickness of insulating layer 11 may be about 5 nm, but preferably is about 7 nm in order to ensure insulating properties.

In the present embodiment, bias magnetic layer 13 is formed such that the elevation of the middle point thereof corresponds to the elevation that is equidistant from the middle point of the upper magnetic layer and the middle point of the lower magnetic layer. As shown in FIG. 12B, the height of bias magnetic layer 13 formed on the side surfaces of upper auxiliary shield layer 3b is preferably limited approximately to the height of upper auxiliary shield layer 3b. As described later, bias magnetic layer 13 must be formed such that a predetermined thickness is ensured. However, if bias magnetic layer 13 is formed such that the height exceeds upper auxiliary shield layer 3b, then a stepped portion occurs between bias magnetic layer 13 and upper auxiliary shield layer 3b. This makes planarization difficult, leading to a very unstable shape of bias magnetic layer 13.

After depositing the layers up to cap layer 14, resist 31 is removed by the lift-off process. After removing resist 31, burrs are removed by extremely light CMP to planarize the surface.

Figure 13A:
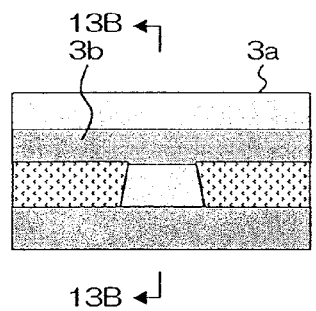
Figure 13B:
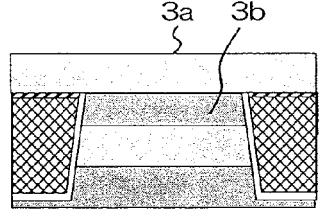
Figure 13C:
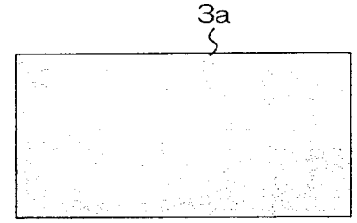

(Step S5) Next, as shown in FIGS. 13A to 13C, general part 3a of upper shield electrode layer 3 is formed above upper auxiliary shield layer 3b and cap layer 14. Specifically, an electrode film which is used to form general part 3a by plating, not shown, having a thickness of about 50 nm is formed by the sputtering process, and general part 3a is then formed thereon by the plating process. Thus, upper shield electrode layer 3 including general part 3a and the auxiliary shield layer 3a is formed.

Thereafter, a write head portion is formed, the wafer is then diced into bars, and the air bearing surface is formed by polishing. Further, each bar is separated into sliders, and the sliders are completed after undergoing processes, such as cleaning and inspections.

Next, a comparison between the conventional CPP element and the magnetic field detecting element according to the present invention will now be described as an exemplary embodiment. The same layer configuration as shown in Tables 1 and 2 in the above-mentioned embodiment was used for the exemplary embodiment, and the element size was set to 0.05 μm both in the track width direction and in the MR height direction. In Table 3, the layer configuration of the CPP element of a comparative example is shown. Although the free layer is a single layer, other parts in the layer configuration were formed to be as similar as possible. In order to enhance the spin-dependent scattering effect at interfaces, Cu intermediate layers were inserted into the pinned layer. The inner pinned layer has a thickness of 4.4 nm, which is substantially the same as the thickness of the free layer. As the antiferromagnetic layer, an IrMn layer having a thickness of 7 nm was used. Since the synthetic pinned layer is used, the outer pinned layer and the antiferromagnetic film increase the total thickness. On both sides of the spin-valve film with regard to the track width direction, CoPt layers having a thickness of 30 nm were formed as the bias magnetic layers via a Al₂O₃ layer having a thickness of 7 nm and a Cr seed layer having a thickness of 3 nm.

TABLE 3

| Layer Configuration | Composition | Thickness(nm) |
|---|---|---|
| Cap Layer 9 | Ru | 10 |
| Free Layer | 70Co30Fe | 1 |
|  | 80Ni20Fe | 2.5 |
|  | 70Co30Fe | 1 |
| Non-magnetic Intermediate Layer | Cu | 3 |
| Inner Pinned Layer | 50Co50Fe | 1.5 |
|  | Cu | 0.2 |
|  | 50Co50Fe | 1.5 |
|  | Cu | 0.2 |
|  | 90Co10Fe | 1 |
| Non-magnetic Intermediate Layer | Ru | 0.8 |
| Outer Pinned Layer | 70Co30Fe | 4 |
| Antiferromagnetic Layer | IrMn | 7 |
| Buffer Layer | NiFeCr | 5 |
|  | Ta | 1 |
| (Total) |  | 39.7 |

The total thickness of the spin-valve film of the comparative example is 39.7 nm, which is twice or more larger than the thickness of the magnetic field detecting element of the exemplary embodiment. Accordingly, the gap between the shields is also twice or more larger than that of the magnetic field detecting element of the exemplary embodiment. On the other hand, the magnetic resistance ratios of the exemplary embodiment and the comparative example were both found to be about 5%. In the comparative example, 50Co50Fe, which has large bulk scattering effect, is used, and Cu layers are inserted in the CoFe layer in order to enhance the boundary scattering effect, whereas parasitic resistance of the antiferromagnetic layer and the outer pinned layer is increased. Accordingly, it is considered that both effects were cancelled out each other and thereby a magnetic resistance ratio of a similar magnitude was obtained.

Next, the electromagnetic conversion characteristics of the above-mentioned exemplary embodiment and the comparative example were compared. A voltage of 100 mV was applied when measurement was conducted. Element resistance (MRR) of the exemplary embodiment and that of the comparative example were found to be 17Ω and 22Ω, respectively. Therefore, the sense current of the exemplary embodiment and that of the comparative example were 5.88 mA and 4.55 mA, respectively. The values of output and PW50 for an isolated read pulse are shown in Table 4. The PW50 is a half-value width of reproduced waveform, which is defined as a relative value when the value of the comparative example is set to be 1 (one). The small value of PW50 implies a narrow gap between the shields. Thus, it is found that the exemplary embodiment facilitates large track recording density while ensuring output that is equivalent to the comparative example.

TABLE 4

|  | MRR (Ω) | Output (mV) | PW50 (Relative Value) |
|---|---|---|---|
| Exemplary Embodiment | 17 | 1.1 | 0.6 |
| Comparative Example | 22 | 1.1 | 1 |

Figure 15:
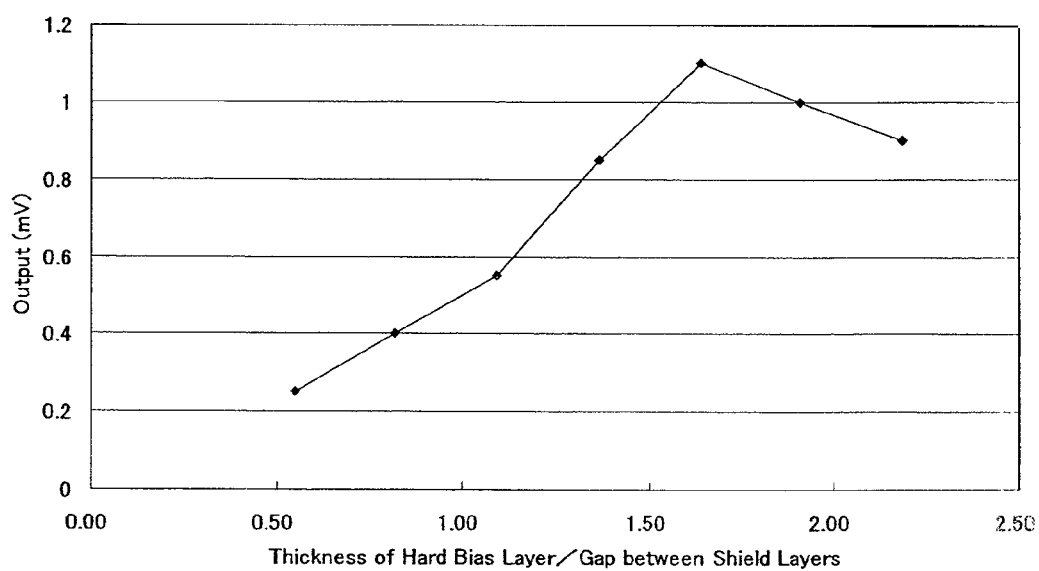
FIG. 15 is a graph showing the relationship between the ratio of the thickness of a bias magnetic layer/the gap between the shields and output.

Next, the relationship between thickness of the bias magnetic layer and output was studied. The thickness of the bias magnetic layer in the layer configuration that is described in the exemplary embodiment was varied within the range between 10 nm and 40 nm to examine the influence on an output. The result is shown in Table 5 and FIG. 15. As described above, if the bias magnetic field is insufficient, then the initial magnetization state is close to the anti-parallel state and only low output is achieved. On the other hand, if the bias magnetic field is excessive, then the initial magnetic field state is close to the parallel state and only low output is achieved. In the present embodiment, the optimum thickness of the bias magnetic layer is about 30 nm, and the preferable range of the ratio of the thickness of the bias magnetic layer to the gap between the shields (the thickness of the stack) is 1.5 to 2.

TABLE 5

| Thickness of Bias Magnetic Layer (nm) X | 10 | 15 | 20 | 25 | 30 | 35 | 40 |
|---|---|---|---|---|---|---|---|
| Gap between Shield Layers (nm) Y | 18.3 | 18.3 | 18.3 | 18.3 | 18.3 | 18.3 | 18.3 |
| X/Y | 0.55 | 0.82 | 1.09 | 1.37 | 1.64 | 1.91 | 2.19 |
| Output (mV) | 0.25 | 0.4 | 0.55 | 0.85 | 1.1 | 1 | 0.9 |

Figure 16A:
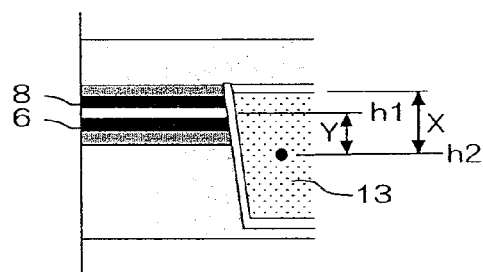
FIGS. 16A and 16B are cross sectional views of comparative examples in which the bias magnetic layer is located at a different elevation with regard to the direction of stacking.
Figure 16B:
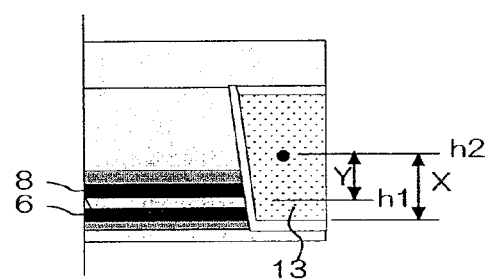

Next, the positional relationship between the bias magnetic layer and the stack, particularly between the bias magnetic layer and the upper and lower magnetic layers was studied. Elevation h2 of the middle point of bias magnetic layer 13 in FIG. 2B was relatively changed with respect to stack 2. Typical comparative examples are shown in FIG. 16A, in which the upper end of upper magnetic layer 8 is flush with the upper end of bias magnetic layer 13, and in FIG. 16B, in which the lower end of lower magnetic layer 6 is flush with the lower end of bias magnetic layer 13, respectively. Assume that a half-value of the thickness of bias magnetic layer 13 is X, difference of the elevation (h1−h2) is Y, where elevation h1 is the elevation equidistant from elevation h8, which is the elevation of the middle point of upper magnetic layer 8 (see FIG. 2B), and elevation h6, which is the elevation of the middle point of lower magnetic layer 6 (see FIG. 2B), and elevation h2 is the elevation of the middle point of bias magnetic layer 13. Y/X is an index that shows how close upper magnetic layer 8 and lower magnetic layer 6 are located to the middle point of bias magnetic layer 13. If the thicknesses of upper magnetic layer 8 and lower magnetic layer 6 are equal to each other, then Y/X is equal to zero when the middle point of the Cu layer, which is non-magnetic intermediate layer 7, corresponds to the middle point of bias magnetic layer 13. If the middle point of the Cu layer corresponds to the end surface of bias magnetic layer 13, Y/X is equal to 1 or −1. In the case of FIGS. 16A, 16B, Y/X is equal to ((30 nm−4.5 nm−0.65 nm)−15 nm)/15 nm=0.66 (or −0.66).

Figure 17:
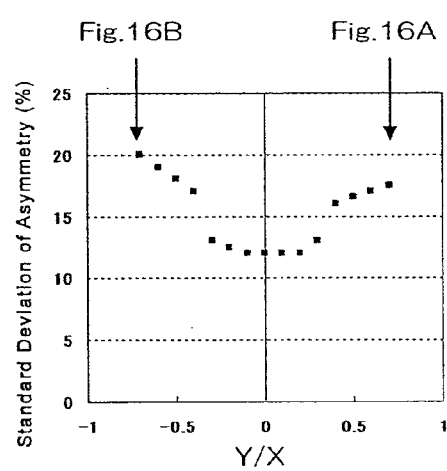
FIG. 17 is a graph showing the relationship between the elevations of the bias magnetic layer and output.

Next, Y/X was changed to determine the standard deviation of asymmetry (deviation of asymmetry of reproduced output waveform). The reason why the standard deviation of asymmetry was used is that it is important in the present invention to uniformly apply bias magnetic field from bias magnetic layer 13 to upper magnetic layer 8 and lower magnetic layer 6. Large deviation of asymmetry indicates that large variation in non-linearlity of response to a magnetic field exists among the elements. FIG. 17 shows the variation (standard deviation) of waveform asymmetry of an output waveform measured by applying an external magnetic field of 23850 A/m (300 Oe). Waveform asymmetry is defined to be |difference between output at minus magnetic field−output at plus magnetic field|/output×100. The standard deviation is larger in the case in which the middle point of the Cu layer is located near the lower end of bias magnetic layer 13 (the case of FIG. 16B) compared to the case in which the middle point of the Cu layer is located near the upper end bias magnetic layer 13 (the case of FIG. 16A). Accordingly, a configuration having thick lower auxiliary shield layer 4b of lower shield electrode layer 4, which is obtained by deep milling of lower shield electrode layer 4, provides a relatively better result as compared to a configuration having thick upper auxiliary shield layer 3b of upper shield electrode layer 3. However, in both cases, a configuration in which the middle point of the Cu layer is far apart from the middle point of bias magnetic layer 13 is not desirable from the viewpoint of symmetry, because a bias magnetic field is not uniformly applied to the two magnetic layers 6 and 8. Ideally, it is desirable that elevation h2, which is the middle point of bias magnetic layer 13, corresponds to elevation h1, which is the elevation equidistant from elevation h8 of the middle point of upper magnetic layer 8 and elevation h6 of the middle point of lower magnetic layer 6, i.e., Y/X=0, as described in the above-mentioned embodiment. However, if $-0.5 \leq Y/X \leq 0.5$ is satisfied, then relatively satisfactory result can be provided. It is considered that this is because Y/X=±0.5 corresponds to inflection points D, E.

While the magnetic field detecting element of the present invention has been explained above in detail, the present invention is not limited to the embodiments and the examples described above. As an example, a layer configuration in which each of the magnetic layers includes two magnetic layers and a non-magnetic intermediate layer sandwiched therebetween is within the scope of the present invention. Table 6 shows an exemplary layer configuration of a stack of such an embodiment. Each of the upper and lower magnetic layers includes first and second magnetic layers whose magnetization direction change in accordance with an external magnetic field and a non-magnetic intermediate layer sandwiched between the first and second magnetic layers. The total stack thickness is 21.5 nm. Although slightly disadvantageous as compared to the above-mentioned embodiment from the viewpoint of the gap between the shields, the stack of the present embodiment is sufficiently advantageous over the conventional art. Such a multilayer structure provides an increase in magnetic resistance ratio because of an increase in interfaces. The magnetic resistance ratio in this layer configuration was found to be 6%. The head that was test-manufactured using this layer configuration exhibited an output of 1.6 mV. The magnetic field detecting element of this embodiment may also be used in accordance with the specification required as the magnetic head.

TABLE 6

| Layer Configuration | | Composition | Thickness (nm) |
|---|---|---|---|
| Cap Layer 9 | | Ru | 4 |
| Upper Magnetic Layer 8 | First Magnetic Layer | Co70Fe30 | 0.7 |
| | | Ni80Fe20 | 1 |
| | | Co70Fe30 | 0.7 |
| | Non-magnetic Intermediate Layer | Cu | 1.3 |
| | Second Magnetic Layer | Co70Fe30 | 0.7 |
| | | Ni80Fe20 | 1 |
| | | Co70Fe30 | 0.7 |
| Non-magnetic Intermediate Layer 7 | | Co70Fe30 | 0.7 |
| Lower Magnetic Layer 6 | First Magnetic Layer | Ni80Fe20 | 1 |
| | | Co70Fe30 | 0.7 |
| | | Cu | 1.3 |
| | Non-magnetic Intermediate Layer | Co70Fe30 | 0.7 |
| | Second Magnetic Layer | Ni80Fe20 | 1 |
| | | Co70Fe30 | 0.7 |

TABLE 6-continued

| Layer Configuration | Composition | Thickness (nm) |
|---|---|---|
| Buffer Layer 5 | Cu | 1.3 |
| | NiCr | 3 |
| | Ta | 1 |
| | (Total) | 21.5 |

Figure 18:
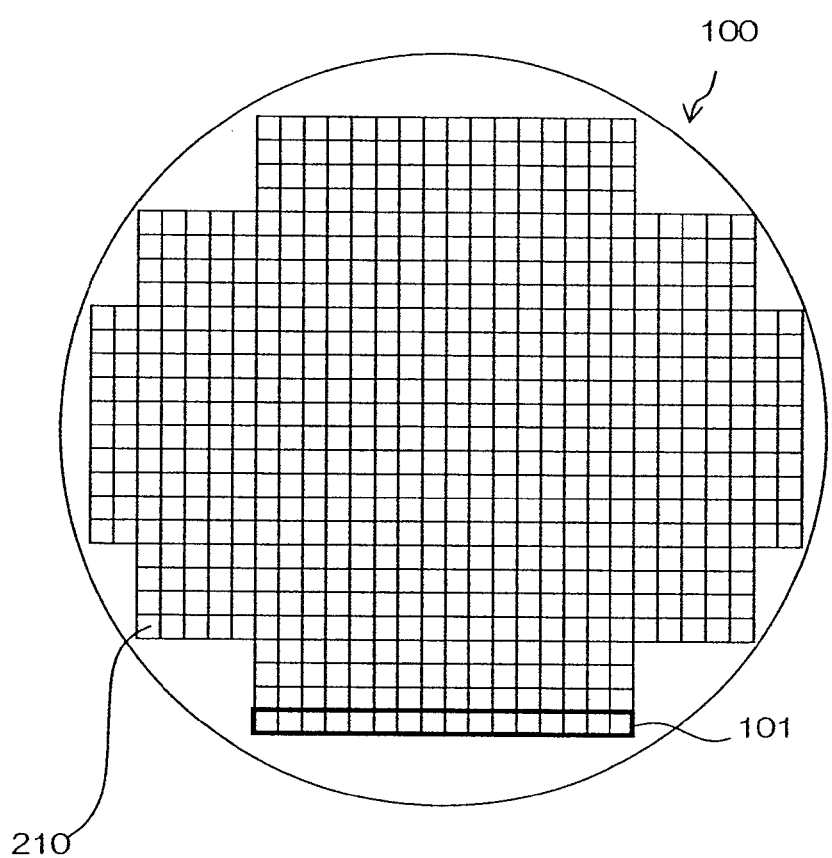
FIG. 18 is a plan view of a wafer which is used to manufacture the magnetic field detecting element of the present invention.

Next, explanation will be made regarding a wafer for fabricating a magnetic field detecting element described above. FIG. 18 is a schematic plan view of a wafer. Wafer 100 has a stack which is deposited thereon to form at least the magnetic field detecting element. Wafer 100 is diced into bars 101 which serve as working units in the process of forming air bearing surface ABS. After lapping, bar 101 is diced into sliders 210 which include thin-film magnetic heads. Dicing portions, not shown, are provided in wafer 100 in order to dice wafer 100 into bars 101 and into sliders 210.

Figure 19:
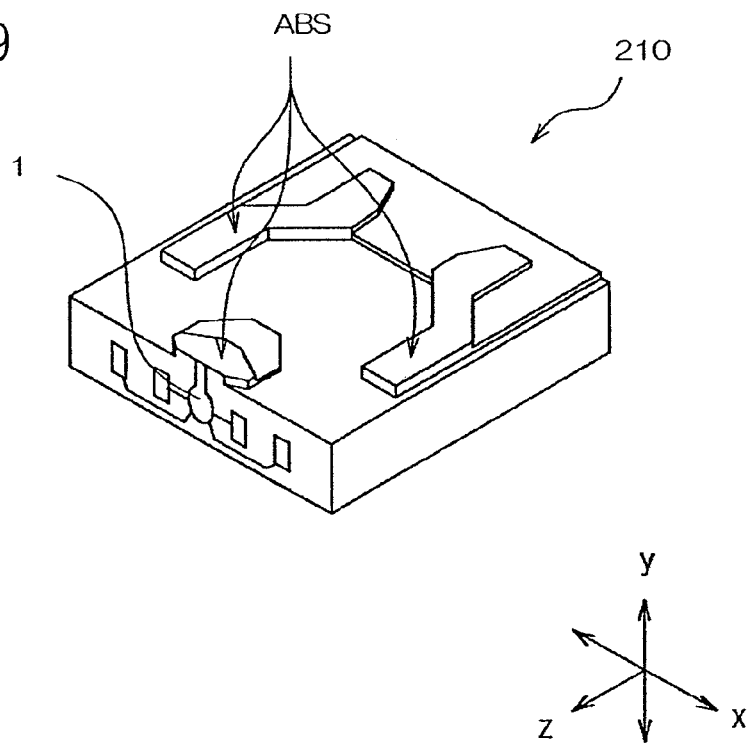
FIG. 19 is a perspective view of a slider of the present invention.

Referring to FIG. 19, slider 210 has a substantially hexahedral shape. One of the six surfaces of slider 210 forms air bearing surface ABS, which is positioned opposite to the hard disk.

Figure 20:
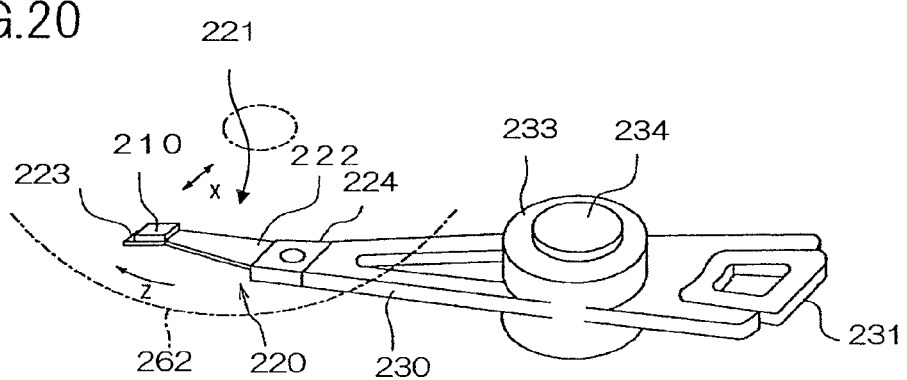
FIG. 20 is a perspective view of a head arm assembly which includes a head gimbal assembly which incorporates a slider of the present invention.

Referring to FIG. 20, head gimbal assembly 220 has slider 210 and suspension 221 for resiliently supporting slider 210. Suspension 221 has load beam 222 in the shape of a flat spring and made of, for example, stainless steel, flexure 223 that is attached to one end of load beam 222, and base plate 224 provided on the other end of load beam 222. Slider 210 is fixed to flexure 223 to provide slider 210 with an appropriate degree of freedom. The portion of flexure 223 to which slider 210 is attached has a gimbal section for maintaining slider 210 in a fixed orientation.

Slider 210 is arranged opposite to a hard disk, which is a rotationally-driven disc-shaped storage medium, in a hard disk drive. When the hard disk rotates in the z direction shown in FIG. 20, airflow which passes between the hard disk and slider 210 creates a dynamic lift, which is applied to slider 210 downward in the y direction. Slider 210 is configured to lift up from the surface of the hard disk due to this dynamic lift effect. Magnetic field detecting element 1 is formed in proximity to the trailing edge (the end portion at the lower left in FIG. 19) of slider 210, which is on the outlet side of the airflow.

The arrangement in which a head gimbal assembly 220 is attached to arm 230 is called a head arm assembly 221. Arm 230 moves slider 210 in transverse direction x with regard to the track of hard disk 262. One end of arm 230 is attached to base plate 224. Coil 231, which constitutes a part of a voice coil motor, is attached to the other end of arm 230. Bearing section 233 is provided in the intermediate portion of arm 230. Arm 230 is rotatably held by shaft 234 which is attached to bearing section 233. Arm 230 and the voice coil motor to drive arm 230 constitute an actuator.

Figure 21:
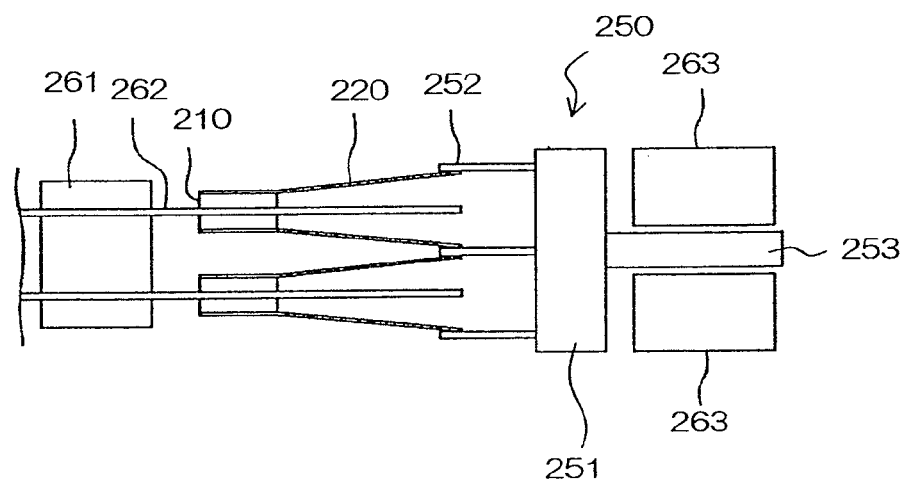
FIG. 21 is a side view of a head arm assembly which incorporates sliders of the present invention.
Figure 22:
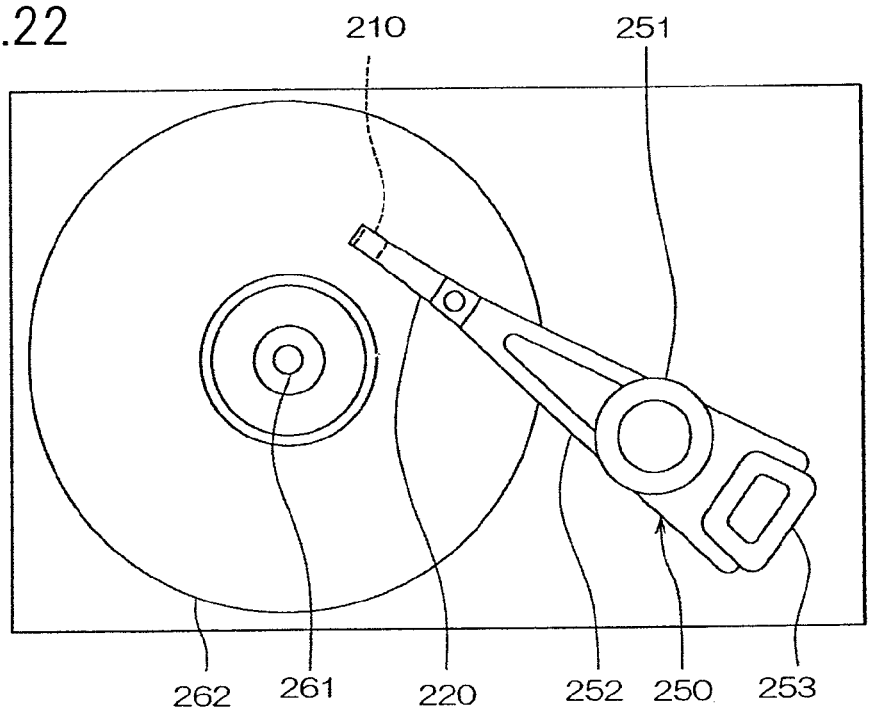
FIG. 22 is a plan view of a hard disk drive which incorporates sliders of the present invention.

Referring to FIG. 21 and FIG. 22, a head stack assembly and a hard disk drive that incorporate the slider mentioned above will be explained next. The arrangement in which head gimbal assemblies 220 are attached to the respective arm of a carriage having a plurality of arms is called a head stack assembly. FIG. 21 is a side view of a head stack assembly, and FIG. 22 is a plan view of a hard disk drive. Head stack assembly 250 has carriage 251 provided with a plurality of arms 252. Head gimbal assemblies 220 are attached to arms 252 such that head gimbal assemblies 220 are arranged apart from each other in the vertical direction. Coil 253, which constitutes a part of the voice coil motor, is attached to carriage 251 on the side opposite to arms 252. The voice coil motor has permanent magnets 263 which are arranged in positions that are opposite to each other and interpose coil 253 therebetween.

Referring to FIG. 22, head stack assembly 250 is installed in a hard disk drive. The hard disk drive has a plurality of hard disks which are connected to spindle motor 261. Two sliders 210 are provided per each hard disk 262 at positions which are opposite to each other and interpose hard disk 262 therebetween. Head stack assembly 250 and the actuator, except for sliders 210, work as a positioning device in the present invention. They carry sliders 210 and work to position sliders 210 relative to hard disks 262. Sliders 210 are moved by the actuator in the transverse direction with regard to the tracks of hard disks 262, and positioned relative to hard disks 262. Magnetic field detecting element 1 that is included in slider 210 writes information to hard disk 262 by means of the write head portion, and reads information recorded in hard disk 262 by means of the read head portion.

Although certain preferred embodiments of the present invention have been shown and described in detail, it should be understood that various changes and modifications may be made without departing from the spirit or scope of the appended claims.

The invention claimed is:

1. A magnetic field detecting element comprising:
    a stack including an upper magnetic layer, a lower magnetic layer and a non-magnetic intermediate layer sandwiched between said upper magnetic layer and said lower magnetic layer, wherein magnetization directions of said upper magnetic layer and said lower magnetic layer change in accordance with an external magnetic field;
    an upper shield electrode layer and a lower shield electrode layer which are provided in a manner that they sandwich said stack therebetween in a direction of stacking of said stack, wherein said upper shield electrode layer and said lower shield electrode layer supply sense current in the direction of stacking and magnetically shield said stack;
    a bias magnetic layer which is provided on a surface of said stack, the surface being opposite to an air bearing surface of said stack, wherein said bias magnetic layer applies a bias magnetic field to said upper magnetic layer and to said lower magnetic layer in a direction perpendicular to the air bearing surface; and
    insulating films which are provided on both sides of said stack with regard to a track width direction thereof, wherein
    said bias magnetic layer has a larger thickness than said stack, and
    said upper shield electrode layer and/or said lower shield electrode layer includes an auxiliary shield layer which fills a stepped portion, the stepped portion being formed by said stack and said bias magnetic layer, wherein said auxiliary shield layer has an end surface opposing the air bearing surface, which is closer to the air bearing surface than said bias magnetic layer.

2. The magnetic field detecting element according to claim 1, wherein $-0.5 \leq Y/X \leq 0.5$ is satisfied,
    wherein X is a half-value of the thickness of said bias magnetic layer, and
    wherein Y is (h1−h2), wherein h1 is an elevation which is equidistant from a middle point of said upper magnetic layer and a middle point of said lower magnetic layer, and h2 is an elevation of a middle point of said bias magnetic layer, h1 and h2 being measured in the direction of stacking.

3. The magnetic field detecting element according to claim 1,
wherein an elevation of a middle point of said bias magnetic layer is equal to an elevation which is equidistant from a middle point of said upper magnetic layer and a middle point of said lower magnetic layer.

4. The magnetic field detecting element according to claim 1,
wherein said auxiliary shield layer extends in a planar form on said insulating films.

5. The magnetic field detecting element according to claim 1,
wherein a magnetization direction of said upper magnetic layer and a magnetization direction of said lower magnetic layer are approximately perpendicular to each other when no external magnetic field is applied.

6. The magnetic field detecting element according to claim 1,
wherein said non-magnetic intermediate layer consists of copper and has a thickness of approximately 1.3 nm.

7. The magnetic field detecting element according to claim 1,
wherein an insulating layer is provided between said stack and said bias magnetic layer.

8. The magnetic field detecting element according to claim 1,
wherein each of said upper magnetic layer and said lower magnetic layer includes a first magnetic layer, a second magnetic layer, and a non-magnetic intermediate layer sandwiched therebetween, wherein a magnetization direction of the first and second magnetic layers changes in accordance with the external magnetic field.

9. A slider including the magnetic field detecting element according to claim 1.

10. A head gimbal assembly including the slider according to claim 9, and a suspension for resiliently supporting the slider.

11. A hard disc drive including the slider according to claim 9, and a device for supporting the slider and for positioning the slider with respect to a recording medium.

12. A wafer having the stack that is formed into the magnetic field detecting element according to claim 1.

* * * * *